(12) United States Patent
Yano et al.

(10) Patent No.: US 9,402,300 B2
(45) Date of Patent: Jul. 26, 2016

(54) SUBSTRATE FOR LIGHT-EMITTING DIODE (71) Applicant: NGK Insulators, Ltd., Nagoya-Shi (JP)

(72) Inventors: Shinsuke Yano, Nagoya (JP); Makoto Tani, Inazawa (JP); Hirokazu Nakanishi, Kakamigahara (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 14/701,730

(22) Filed: May 1, 2015

(65) Prior Publication Data

US 2015/0237708 A1 Aug. 20, 2015

Related U.S. Application Data (63) Continuation of application No. PCT/JP2012/078751, filed on Nov. 6, 2012.

(51) Int. Cl.
| H05K 1/00 | (2006.01) |
| H05K 1/03 | (2006.01) |
| H05K 1/09 | (2006.01) |
| H05K 1/16 | (2006.01) |
| H05K 1/02 | (2006.01) |

(Continued)

(52) U.S. Cl.
CPC ............ *H05K 1/0203* (2013.01); *H01L 33/486* (2013.01); *H05K 1/0298* (2013.01); *H05K 1/053* (2013.01); *H05K 2201/062* (2013.01); *H05K 2201/068* (2013.01)

(58) Field of Classification Search
CPC ... H05K 1/0203; H05K 1/053; H05K 1/0298; H05K 2201/062; H05K 2201/068

USPC ............... 174/252, 255, 257, 258, 260, 261; 361/767
See application file for complete search history.

(56) References Cited

U.S. PATENT DOCUMENTS 6,233,817 B1 * 5/2001 Ellis ..................... H01L 23/142
257/E23.006
6,548,832 B1 4/2003 Sakamoto et al.
(Continued)

FOREIGN PATENT DOCUMENTS

CN 101005108 B 7/2011
EP 1 890 342 A1 2/2008
(Continued)

OTHER PUBLICATIONS

U.S. Appl. No. 14/701,792, filed May 1, 2015, Shinsuke Yano et al.
(Continued)

*Primary Examiner* — Sherman Ng
(74) *Attorney, Agent, or Firm* — Burr & Brown, PLLC (57) ABSTRACT

A substrate for a light-emitting diode comprising a metal base with a thickness of a predetermined value or more is constituted so that the thickness of a top conductor for an electrical connection with a light-emitting diode (LED) in a predetermined range falls within a predetermined range and the thickness of an insulation layer which electrically insulates the metal base and the top conductor and the thickness of the top conductor meet a predetermined relation. Thereby, a substrate for a light-emitting diode which can show a high heat dissipation capacity by achieving a low thermal resistance as the total thermal resistance of the whole substrate without reducing an insulation reliability and high-humidity reliability of the substrate is provided.

3 Claims, 2 Drawing Sheets (51) Int. Cl.
*H01L 33/48* (2010.01)
*H05K 1/05* (2006.01)

(56) References Cited

U.S. PATENT DOCUMENTS

| | | | | |
|---|---|---|---|---|
| 6,818,836 | B2 * | 11/2004 | Shiraishi | H01L 21/4857 174/260 |
| 7,952,113 | B2 * | 5/2011 | Layer | F21K 9/00 257/103 |
| 2006/0258055 | A1 * | 11/2006 | Okamoto | H01L 23/3735 438/124 |
| 2008/0043444 | A1 | 2/2008 | Hasegawa et al. | |
| 2009/0035538 | A1 | 2/2009 | Namerikawa et al. | |
| 2009/0039379 | A1 | 2/2009 | Shiraishi et al. | |
| 2009/0151982 | A1 * | 6/2009 | Oshika | H01L 23/142 174/126.2 |
| 2011/0089805 | A1 | 4/2011 | Betsuda et al. | |
| 2011/0169037 | A1 | 7/2011 | Hasegawa et al. | |
| 2011/0233601 | A1 | 9/2011 | Nakayama | |
| 2013/0001632 | A1 * | 1/2013 | Imai | H01L 33/62 257/99 |

FOREIGN PATENT DOCUMENTS

| | | |
|---|---|---|
| EP | 2 455 991 A1 | 5/2012 |
| JP | 2000-353826 A1 | 12/2000 |
| JP | 2004-228170 A | 8/2004 |
| JP | 2006-066630 A | 3/2006 |
| JP | 2006-525679 A1 | 11/2006 |
| JP | 2007-123482 A1 | 5/2007 |
| JP | 2008-159791 A1 | 7/2008 |
| JP | 2009-029134 A1 | 2/2009 |
| JP | 2009-044027 A1 | 2/2009 |
| JP | 2009-208459 A1 | 9/2009 |
| JP | 2010-274256 A1 | 12/2010 |
| JP | 2011-040622 A1 | 2/2011 |
| JP | 2011-205009 A1 | 10/2011 |
| JP | 2011-233775 A1 | 11/2011 |
| JP | 2012-084733 A1 | 4/2012 |
| JP | 2012-109513 A1 | 6/2012 |
| JP | 2012-140289 A1 | 7/2012 |
| WO | 2004/100343 A2 | 11/2004 |
| WO | 2007/058438 A1 | 5/2007 |
| WO | 2012/067203 A1 | 5/2012 |
| WO | 2012/067204 A1 | 5/2012 |

OTHER PUBLICATIONS

International Search Report and Written Opinion (Application No. PCT/JP2012/078751) dated Feb. 5, 2013.
International Preliminary Report on Patentability (Application No. PCT/JP2012/078751) dated Jan. 20, 2015.
European Search Report, European Application No. 12 88 7975, dated Apr. 7, 2016 (10 pages).

* cited by examiner

FIG. 1

FIG. 2

SUBSTRATE FOR LIGHT-EMITTING DIODE

BACKGROUND OF THE INVENTION

1. Field of the Invention

The present invention relates to a substrate for a light-emitting diode. More particularly, the present invention relates to a substrate for a light-emitting diode which can show a high heat dissipation capacity by achieving a low thermal resistance as the total thermal resistance of the whole substrate.

2. Description of Related Art

While a light-emitting diode (LED) is increasingly widely used recent years from viewpoints of energy saving etc., since an energy efficiency will fall when the temperature of an LED rises, it is important for an LED to efficiently release heat which is generated in association with a light emission, and to prevent a temperature-rise of the LED. Then, in the art, various technologies for raising a heat dissipation capacity in a package and wiring substrate on which an LED is mounted have been proposed.

As an example of such technologies, for example, a technology for reducing a total thermal resistance of a whole substrate, by using as a wiring substrate a structure (heat slag type) in which an insulation layer is formed on a top of a metal base comprising (for instance, metals, such as aluminum, copper, silver and tungsten, and alloys of any of these metals, etc.) and a conductive pattern for an electrical connection with an LED is formed on a top of the insulation layer, or by using as a wiring substrate a structure (heat spreader type) in which a metal base is embedded in an insulation material with a conductive pattern for an electrical connection with an LED formed on its top, can be exemplified (for instance, refer to PTLs 1 and 2).

Since a substrate which comprises a metal base with a high thermal conductivity mentioned above has a lower thermal resistance as the total thermal resistance of the whole substrate as compared with a substrate which does not comprise such a metal base, it can more efficiently release heat which is generated in association with a light emission of LED. However, an insulation layer formed on a top of a metal base generally comprises as a main material, dielectric materials, such as a resin and a ceramic, for example, and these dielectric materials have a lower thermal conductivity as compared with a metal base. A relatively low thermal conductivity, which such as insulation layer has, becomes a bottleneck in heat conduction between a conductive pattern and a metal base. Namely, when a heat dissipation capacity of a substrate is going to be further improved by further reducing a total thermal resistance of the whole substrate, there is a possibility that a relatively low thermal conductivity that an insulation layer has may become an obstacle.

The obstacle as mentioned above in a further improvement in a heat dissipation capacity of a substrate due to a relatively low thermal conductivity which an insulation layer has can be suppressed by reducing the thickness of the insulation layer, for example (for instance, refer to PTL 2). However, in a substrate according to a conventional technology, when a total thermal resistance of a whole substrate is going to be reduced by reducing a thickness of an insulation layer, there is a possibility of causing reduction of insulation reliability in the substrate. Specifically, in association with reduction of the thickness of an insulation layer, there is a possibility that it may become difficult to secure the electric insulation with a conductive pattern and a metal base and an electrical short (short-circuit) between conductive patterns through a metal base may be caused, for example.

On the other hand, although it is desirable that the thickness of an insulation layer is large from a viewpoint of securing an insulation reliability of a substrate, the more the thickness of the insulation layer increases, the more the thermal resistance as the total thermal resistance of the whole substrate increases and the more the heat dissipation capacity of the whole substrate falls due to the relatively low thermal conductivity which the insulation layer has. In addition, a way of the dimensional change accompanying a temperature change (hereinafter, may be referred to as a "thermal expansion shrinkage behavior") is different between a dielectric material which constitutes an insulation layer (for instance, a resin, a ceramic, etc.) and a material which constitutes a metal base and a conductive pattern (for instance, a metal, etc.). Therefore, there is a possibility that a fissure (crack) may occur in an insulation layer due to the above-mentioned difference in thermal expansion shrinkage behavior and so on to cause a problem, such as a reduction of a reliability of a substrate under a high-humidity environment (high-humidity reliability), for instance, in connection with the temperature change of the substrate in a manufacturing process of a substrate, in an implementation process of a package which contains an LED, and in an operation period after completion of the package containing an LED, etc., for example. Moreover, the larger the thickness of a metal base is, the more such a concern becomes noticeable. Furthermore, when a ceramic is adopted as a dielectric material which constitutes an insulation layer and a substrate is manufactured by co-firing such an insulation layer with a metal base and a conductive pattern, such a concern becomes more noticeable.

As mentioned above, in the art, there is a demand for a substrate for a light-emitting diode which can show a high heat dissipation capacity by achieving a low thermal resistance as the total thermal resistance of the whole substrate, without reducing an insulation reliability and high-humidity reliability of the substrate.

CITATION LIST

Patent Literature

[PTL 1] Japanese Patent Application Laid-Open (kokai) No. 2000-353826
[PTL 2] Japanese Patent Application Laid-Open (kokai) No. 2006-525679
[PTL 3] Japanese Patent Application Laid-Open (kokai) No. 2009-208459
[PTL 4] Japanese Patent Application Laid-Open (kokai) No. 2009-029134

SUMMARY OF THE INVENTION

Technical Problem

As mentioned above, in the art, there is a demand for a substrate for a light-emitting diode which can show a high heat dissipation capacity by achieving a low thermal resistance as the total thermal resistance of the whole substrate, without reducing an insulation reliability and high-humidity reliability of the substrate. The present invention has been conceived in order to meet such a demand. Namely, the present invention has one purpose to provide a substrate for a light-emitting diode which can show a high heat dissipation capacity by achieving a low thermal resistance as a total thermal resistance of a whole substrate, without reducing an insulation reliability and high-humidity reliability of a substrate.

Solution to Problem

The above-mentioned purpose is attained by,
a substrate for a light-emitting diode, comprising:
a metal base,
an insulation layer which comprises a dielectric material that mainly contains a ceramic and which is placed on at least one top of said metal base, and
a top conductor which is placed on the top of said insulation layer on the side opposite to said metal base,
wherein:
the thickness (Tm) of said metal base in a thickness direction which is defined as a direction intersecting perpendicularly with said at least one top of said metal base is not less than 100 micrometers,
the thickness (Tc) of said top conductor in said thickness direction is not less than 20 micrometers and 100 micrometers or less, and
the thickness (Ti) of said insulation layer in said thickness direction and said thickness (Tc) of said top conductor in said thickness direction meet the relation expressed by a formula (1) shown below.

$$-40 \times Ti + 260 \leq Tc \leq -40 \times Ti + 1620 \quad (1)$$

Advantageous Effects of Invention

In accordance with the substrate for a light-emitting diode according to the present invention, a high heat dissipation capacity can be shown by achieving a low thermal resistance as the total thermal resistance of the whole substrate, without reducing an insulation reliability and high-humidity reliability of the substrate. As a result, it can be suppressed that the temperature of an LED rises by heat generation in association with a light emission and the energy efficiency of the LED falls, without reducing an insulation reliability and high-humidity reliability of a package containing the LED.

DETAILED DESCRIPTION OF THE INVENTION

As mentioned above, the present invention has one purpose to provide a substrate for a light-emitting diode which can show a high heat dissipation capacity by achieving a low thermal resistance as a total thermal resistance of a whole substrate, without reducing an insulation reliability and high-humidity reliability of a substrate. As a result of a wholehearted investigation in order to attain the above-mentioned purpose, the present inventor has found out that, in a substrate for a light-emitting diode comprising a metal base with a thickness of a predetermined value or more, by configuring it so that the thickness of a top conductor for an electrical connection with a light-emitting diode (LED) falls within a predetermined range and the thickness of an insulation layer which electrically insulates a metal base and a top conductor and the thickness of the top conductor meet a predetermined relation to achieve a low thermal resistance as the total thermal resistance of the whole substrate, a high heat dissipation capacity can be shown without reducing an insulation reliability and a high-humidity reliability of the substrate, and has conceived the present invention.

Namely, the first embodiment of the present invention is,
a substrate for a light-emitting diode, comprising:
a metal base,
an insulation layer which comprises a dielectric material that mainly contains a ceramic and which is placed on at least one top of said metal base, and
a top conductor which is placed on the top of said insulation layer on the side opposite to said metal base,
wherein:
the thickness (Tm) of said metal base in a thickness direction which is defined as a direction intersecting perpendicularly with said at least one top of said metal base is not less than 100 micrometers,
the thickness (Tc) of said top conductor in said thickness direction is not less than 20 micrometers and 100 micrometers or less, and
the thickness (Ti) of said insulation layer in said thickness direction and said thickness (Tc) of said top conductor in said thickness direction meet the relation expressed by a formula (1) shown below.

$$-40 \times Ti + 260 \leq Tc \leq -40 \times Ti + 1620 \quad (1)$$

As mentioned above, a substrate for a light-emitting diode according to the present embodiment is,
a substrate for a light-emitting diode, comprising:
a metal base,
an insulation layer which comprises a dielectric material that mainly contains a ceramic and which is placed on at least one top of said metal base, and
a top conductor which is placed on the top of said insulation layer on the side opposite to said metal base.

The above-mentioned metal base may be constituted by what kind of material as long as it is a material which has a higher thermal conductivity as compared with the above-mentioned insulation layer. As an example of such a metal base, for example, a metal base containing a metal which have a high thermal conductivity (for instance, metals, such as aluminum, copper, silver and tungsten, and alloys of any of these metals, etc.). Moreover, the above-mentioned metal base may be constituted by a material currently widely used in the art, for example, as a material which constitutes a heat slag or a heat spreader. Furthermore, ceramic powder which has a high thermal conductivity may be mixed into the material of the above-mentioned metal base. Thereby, when co-firing a metal base material, an insulation material and a top conductor, their behaviors accompanying the firing (for instance, a thermal expansion shrinkage behavior, etc.) can be matched as much as possible to make it easy to manufacture a substrate and improve the quality of the resulting substrate. As such a ceramic powder, aluminum nitride (AlN), silicon nitride ($Si_3N_4$), silicon carbide (SiC), alumina ($Al_2O_3$), copper oxide (CuO) and spinel system chemical compounds, etc. can be exemplified.

Moreover, the above-mentioned insulation layer is constituted by a dielectric material which mainly contains a ceramic. Such a ceramic can be suitably chosen from various ceramics currently widely used in the art, for example, for a dielectric material which constitutes a base material of a wiring substrate. In addition, the above-mentioned insulation layer is placed on at least one top of the above-mentioned metal base as mentioned above. Namely, the above-mentioned insulation layer may be laminated so as to cover at least one portion of one or more specific tops of the above-mentioned metal base. Alternatively, the above-mentioned metal base may be embedded inside of the above-mentioned insulation layer. In other words, the above-mentioned insulation layer is placed between the above-mentioned metal base and the above-mentioned top conductor so as to electrically insulate the above-mentioned metal base and the above-mentioned top conductor. As long as such requirements are satisfied, any of the tops of the above-mentioned metal base or its portion may be exposed at the top of the above-mentioned substrate.

Furthermore, it is desirable that the above-mentioned top conductor comprises a good conductor which has a small electrical resistance. Such a good conductor can be suitably chosen from various conductive materials currently widely used in the art for a conductive material which constitutes the electric circuit of such a circuit substrate. In addition, the above-mentioned top conductor is placed on the top of the above-mentioned insulation layer on the side opposite to the above-mentioned metal base. Thereby, the above-mentioned top electrode can be electrically connected with an electrode (an anode electrode or cathode electrode) of an LED with a technique, such as a soldering, for example, when mounting the LED on the above-mentioned substrate.

In addition, as a matter of course, the above-mentioned top electrode may be connected with another conductive pattern for electrically connecting the above-mentioned substrate on which the LED is mounted with another wiring substrate which constitutes a package containing the LED, etc. Specifically, for example, the above-mentioned top electrode may be electrically connected with an electrode placed on the top on the side opposite to the top electrode of the above-mentioned substrate through a via electrode placed so as to penetrate the above-mentioned substrate.

The above-mentioned substrate may be manufactured by what kind of technique, as long as it is possible to constitute a conformation as mentioned above. For instance, a concrete method for manufacturing a substrate which has a conformation as mentioned above can be suitably chosen from various methods widely used in the art, for example, for a production method of a wiring substrate which adopts a base material comprising a dielectric material that mainly contains a ceramic. As a general example of such a method, what is called a "doctor blade method" and a "gel-casting method", etc., can be exemplified, for example.

When the former "doctor blade method" is adopted, the above-mentioned substrate can be manufactured, for example, by mixing raw powder containing a dielectric material and a sintering aid (such as glass), an organic binder, a plasticizing agent and a solvent, etc. to prepare a slurry, forming the resulting slurry into a sheet-like compact (green sheet) which has a desired thickness using a doctor-blade forming machine, punching the green sheet into a desired size, piercing an open via (through-hole) if needed, printing a paste containing a conductive material, such as silver, on the top of the green sheet (and inside of the via) using a technique, such as a screen printing, etc., for example, to place a conductive pattern, precisely accumulating a plurality of the resulting green sheets, laminating them through application of heat and pressure to unify them into a compact and firing the resulting compact.

On the other hand, when the above "gel-casting method" is adopted, the above-mentioned substrate can be manufactured, for example, by disposing a conductive pattern using a printing method, such as a screen printing, on the top of a protective backing material, for instance, in the shape of a film or a sheet, injecting a slurry of a dielectric material into the portion in which a conductive pattern was not placed, solidifying the slurry to obtain a sheet of the dielectric material in which the conductive pattern is placed thereon and/or embedded therein, laminating required numbers of the resulting sheets to constitute the conductive pattern as a top electrode and/or an inner-layer electrode, and firing a resulting compact.

In addition, for the above-mentioned protective backing material, it is desirable to use a resin film, such as a polyethylene terephthalate (PET) film and a polyethylene naphthalate (PEN) film, etc., and various materials in the shape of a film or a sheet, such as a glass plate, paper and a metal, besides a resin film. However, for a protective backing material, it is desirable to use a material with flexibility from a viewpoint of the ease of a peel-off operation.

Moreover, a remover etc. may be applied to the top of the above-mentioned protective backing material for the purpose of enabling it to easily peel off the sheet of the above-mentioned dielectric material from the protective backing material, for example. Such removers include various agents known as a release agent in the art, for example. More specifically, for such a remover, a well-known silicone series remover and a fluorine system remover, etc. can be used.

It is desirable that the above-mentioned conductive pattern is placed by forming a conductive paste which comprises, for example, at least one or more kinds of metals chosen from gold, silver and copper, etc. and a thermo-setting resin precursor for principal components on the top of the above-mentioned protective backing material using a method, such as a screen printing, for example. As for such a thermo-setting resin precursor, phenol resin, resole resin, urethane resin, epoxy resin and melamine resin, etc. can be used. Among these, phenol resin and resole resin are especially preferable. After printing such a conductive paste on the top of the above-mentioned protective backing material, a conductive pattern can be obtained by hardening a binder contained in this conductive paste.

As the above-mentioned slurry of a dielectric material, for example, a slurry comprising a resin, ceramic powder, glass powder and a solvent can be exemplified. Here, the resin can function as what is called a "binder" and, for instance, thermo-setting resins, such as phenol resin, resole resin or polyurethane resin, or polyurethane precursors comprising polyol and polyisocyanate can be used. Among these, a thermo-setting resin precursor comprising polyol and polyisocyanate is especially preferable.

As for ceramic powder, any of an oxide system ceramic or a non-oxide system ceramic may be used. For instance, alumina ($Al_2O_3$), zirconia ($ZrO_2$), barium titanate ($BaTiO_3$), silicon nitride ($Si_3N_4$), silicon carbide (SiC), aluminum nitride (AlN), barium oxide (BaO), titanium oxide ($TiO_2$), silica ($SiO_2$), zinc oxide ($ZnO_2$) and neodymium oxide ($Nd_2O_3$), etc. can be used. As for glass powder, what comprises of various oxides can be used. Specifically, glass consisting of two or more kinds of components suitably chosen from zinc oxide (ZnO), barium oxide (BaO), boron oxide ($B_2O_3$), silicon oxide ($SiO_2$), magnesium oxide (MgO), aluminum oxide ($Al_2O_3$) and calcium oxide (CaO), and oxides of alkali metals, etc. can be used. Moreover, only one kind of these materials may be used alone, or two or more kinds may be used in combination. Furthermore, as long as a slurry can be prepared, the particle diameters of the ceramic powder and the glass powder are not limited in particular.

Moreover, the above-mentioned solvents are not especially limited, as long as it can dissolve a resin as the above-mentioned binder (and a dispersant, if used). As a concrete example of a solvent, for example, solvent which has two or more ester bonds in the molecule, such as polybasic-acid esters (for instance, dimethyl glutarate, etc.) and acid esters of polyvalent alcohol (for instance, triacetin (glyceryl triacetate), etc.), etc., can be exemplified.

Furthermore, the slurry of the above-mentioned dielectric material may contain a dispersant in addition to the above-mentioned resin, ceramic powder and solvent. As an example of a dispersant, for example, polycarboxylic-acid system copolymers, polycarboxylate, etc. can be exemplified. By adding such a dispersant, low viscosity and high fluidity can be imparted to the slurry before forming.

A compact thus obtained is fired (co-fired) at a predetermined temperature for a predetermined period under a predetermined circumstance, and a fired object of the compact is obtained. In addition, a "gel-casting method" as mentioned above may be referred to as a "gel slurry casting method", etc. (for instance, refer to PTL 3). In addition, the contents of the disclosures in the prior art literatures are incorporated into this specification by reference.

In addition, as for a method for forming a sheet of a dielectric material with a conductive pattern embedded therein, which is obtained by injecting a slurry of a dielectric material into the portion, on which a conductive pattern was not placed, of a protective backing material with the conductive pattern placed on the top as mentioned above and hardening the slurry, a dispenser method and a spin coat method, etc. can be adopted besides the above, for example. Furthermore, what is called a "gel paste method" can be also adopted as such a method.

Specifically, a method in which a base (base with a conductive pattern formed on its top) is placed between a pair of guide plates, a ceramic slurry is coated on the base to cover the conductive pattern with the ceramic slurry, and thereafter, for instance, a blade-like jig is slid on the upper top of the above-mentioned pair of guide plates to remove (strickle) an excessive ceramic slurry, can be adopted. In this method, the thickness of a ceramic slurry can be easily adjusted by adjusting the height of the pair of guides (for instance, refer to PTL 4. In addition, the content of the disclosure in this prior art literature is incorporated into this specification by reference.

By the way, as mentioned in the beginning, in a substrate on which a light-emitting diode (LED) is mounted (substrate for a light-emitting diode), it is desirable to suppress decrease in an energy efficiency resulting from the temperature-rise of the LED by efficiently releasing the heat which is generated in association with a light emission of the LED and preventing the temperature-rise of the LED. The above-mentioned metal base is included as one of the components which constitute the substrate for a light-emitting diode according to the present embodiment for such a purpose.

In addition, the above-mentioned metal base comprises, for example, a metal which has a high thermal conductivity (for instance, such as aluminum, copper, silver and tungsten, and alloys of any of these metals, etc.), as mentioned above. Thereby, the above-mentioned metal base can transmit efficiently the heat which is generated in association with a light emission of the LED and can release it to the exterior of the substrate. In order to sufficiently show such an effect, it is desirable that the thickness (dimension in a direction which intersects perpendicularly with a principal plane of the substrate) of the above-mentioned metal base is large. Therefore, also as for the metal base which the substrate for a light-emitting diode according to the present embodiment comprises, it is desirable that the thickness (dimension in a direction which intersects perpendicularly with a principal plane of the substrate) of the metal base is large. Specifically, it is desirable that the thickness (dimension in a direction which intersects perpendicularly with a principal plane of the substrate) of the above-mentioned metal base is not less than 100 micrometers.

Therefore, as mentioned above, in the substrate for a light-emitting diode according to the present embodiment, the thickness (Tm) of said metal base in a thickness direction which is defined as a direction intersecting perpendicularly with said at least one top of said metal base is not less than 100 micrometers. Thereby, in the substrate for a light-emitting diode according to the present embodiment, the thick metal base can more efficiently conduct the heat, which is generated in association with a light emission of the LED, toward the principal plane of the substrate on the side opposite to the side on which the LED is placed and perform an efficient thermal conduction is possible also in a direction parallel to the principal plane (in-plane direction). As a result, the heat which is generated in association with a light emission of the LED can be transmitted and diffused efficiently in the substrate, and can be released efficiently to the exterior of the substrate, for instance, through the principal plane on the side opposite to the side on which the LED is placed of the substrate, etc. In addition, more preferably, it is desirable that the thickness (Tm) of the above-mentioned metal base is not less than 150 micrometers.

By the way, as mentioned above, from a viewpoint of securing an insulation reliability of a substrate, it is desirable that the thicknesses of a metal base which efficiently conducts heat, which is generated in association with a light emission of an LED, within a substrate and an insulation layer for electrically insulating a top conductor which establishes an electrical connection between the substrate and the LED are large. However, the more the thickness of the insulation layer increases, the more a total thermal resistance of the whole substrate increases and a heat dissipation capacity of the whole substrate fall, due to a relatively low thermal conductivity which the insulation layer has. In addition, there is a possibility that various problems resulting from a difference in thermal expansion shrinkage behavior between the dielectric material constituting the insulation layer (in the present embodiment, the dielectric material mainly comprising a ceramic) and the material constituting the metal base and the top conductor (for instance, a metal, etc.) (for instance, an occurrence of a fissure (crack) in the insulation layer in connection with the temperature change of the substrate, in a manufacturing process of the substrate, in an implementation process of a package which contains the LED, and in an operation period after completion of the package containing the LED, etc.) may occur to cause a problem, such as a reduction of a reliability of the substrate under a high-humidity environment (high-humidity reliability). Moreover, the larger the thickness of the metal base is, the more such a concern becomes noticeable. Especially, in the substrate according to the present embodiment, in which a ceramic is adopted as the dielectric material which constitutes the insulation layer, a concern as mentioned above becomes more noticeable when the substrate is manufactured by co-firing such insulation layer with the metal base and the top conductor.

Therefore, in order to show a high heat dissipation capacity by achieving a low thermal resistance as the total thermal resistance of the whole substrate without reducing the insulation reliability and high-humidity reliability of the substrate in the substrate for a light-emitting diode according to the present embodiment comprising a thick metal base thick as mentioned above, it is important to reduce a concern as mentioned above. Then, as mentioned above, as a result of a wholehearted investigation, the present inventor has found out that, in a substrate for a light-emitting diode comprising a metal base with a thickness of a predetermined value or more, by configuring it so that the thickness of a top conductor for an electrical connection with a light-emitting diode (LED) falls within a predetermined range and the thickness of an insulation layer which electrically insulates a metal base and a top conductor and the thickness of the top conductor meet a predetermined relation to achieve a low thermal resistance as the total thermal resistance of the whole substrate, a high heat dissipation capacity can be shown without reducing an insulation reliability and a high-humidity reliability of the substrate.

Specifically, as for the thickness (Tc) of the top conductor in the substrate for a light-emitting diode according to the present embodiment comprising the metal base which has a thickness of not less than 100 micrometers, a lower limit (for instance, 5 micrometers) exists naturally, from viewpoints of a soldering property with an LED and a bonding strength with a substrate, etc., for example. However, the present inventor has found out that an effect to reduce a total thermal resistance of a whole substrate appears more noticeably when the thickness (Tc) of the top conductor is not less than 20 micrometers. More preferably, it is desirable that the thickness (Tc) of the top conductor in the substrate for a light-emitting diode according to the present embodiment is not less than 30 micrometers.

On the other hand, as mentioned above, from a viewpoint of reducing various problems resulting from the difference in a thermal expansion shrinkage behavior between a dielectric material (mainly ceramic) which constitutes an insulation layer and a material which constitutes a metal base and a top conductor (for instance, an occurrence of a fissure (crack) in the insulation layer in connection with the temperature change of the substrate, etc.), there is also an upper limit in the thickness (Tc) of the top conductor in the substrate for a light-emitting diode according to the present embodiment. Specifically, the thickness (Tc) of the top conductor in the substrate for a light-emitting diode according to the present embodiment is 100 micrometers or less. Thereby, a concern as mentioned above is prevented from increasing. More preferably, it is desirable that the thickness (Tc) of the top conductor in the substrate for a light-emitting diode according to the present embodiment is 75 micrometers or less.

Namely, in the substrate for a light-emitting diode according to the present embodiment, as mentioned above, the thickness (Tc) of said top conductor in said thickness direction is not less than 20 micrometers and 100 micrometers or less.

Moreover, as mentioned above, an obstacle in a further improvement in a heat dissipation capacity of a substrate resulting from a relatively low thermal conductivity which an insulation layer has can be relieved by reducing the thickness (Ti) of an insulation layer (for instance, refer to PTL 2). However, when the total thermal resistance of the whole substrate is going to be reduced by reducing the thickness (Ti) of the insulation layer, there is a possibility of causing a reduction of an insulation reliability in the substrate. Specifically, there is a possibility that it may become difficult to secure an electric insulation between the top conductor and the metal base in association with reduction of the thickness (Ti) of the insulation layer and, for instance, an electrical short (short-circuit) of the top conductors through the metal base (an electrical short of other conductive patterns or an electrical short of the top conductor and another conductive pattern when the substrate comprises conductive patterns other than the top conductor) may be caused. Thus, a lower limit naturally exists in the thickness (Ti) of an insulation layer from a viewpoint of securing an insulation reliability in a substrate. On the contrary, the larger the thickness (Ti) of an insulation layer becomes, the more the total thermal resistance of the whole substrate increases, and therefore an upper limit also exists in the thickness (Ti) of an insulation layer.

However, as a result of a wholehearted investigation, the present inventor has found out that the lower and upper limits of thickness (Ti) of an insulation layer as mentioned above is not determined independently regardless of other components, but these lower and upper limits have a specific relation with the thickness (Tc) of a top conductor. Specifically in the substrate for a light-emitting diode according to the present embodiment, the thickness (Ti) of said insulation layer in said thickness direction and said thickness (Tc) of said top conductor in said thickness direction meet a relation expressed by a formula (1) shown below.

$$-40 \times Ti + 260 \leq Tc \leq -40 \times Ti + 1620 \qquad (1)$$

In the substrate for a light-emitting diode according to the present embodiment, a high heat dissipation capacity can be shown without reducing an insulation reliability and a high-humidity reliability of the substrate, by configuring the thickness (Ti) of an insulation layer and the thickness (Tc) of a top conductor so as to meet the above-mentioned relational expression to achieve a low thermal resistance as the total thermal resistance of the whole substrate. As a result, in accordance with the substrate for a light-emitting diode according to the present embodiment, reduction of the energy efficiency of the LED due to the temperature-rise of the LED by heat generation accompanying a light emission of the LED can be suppressed without reducing the insulation reliability and high-humidity reliability of a package containing the LED.

By the way, while two electrodes (an anode electrode and a cathode electrode) of an LED may be respectively placed on different surfaces (for instance, surfaces facing toward the opposite side mutually) of an LED element, both of the two electrodes may be placed on the same surface of an LED element. In the latter case, the top conductor which the substrate for a light-emitting diode according to the present embodiment comprises needs to be configured so as to separately establish an electrical connection with respective one of the two electrodes (an anode electrode and a cathode electrode) of the LED. Therefore, the top conductor which the substrate for a light-emitting diode according to the present embodiment comprises may be divided into at least two or more regions.

Therefore, the second embodiment of the present invention is, the substrate for a light-emitting diode according to said first embodiment of the present invention, wherein:

said top conductor is divided into at least two or more regions.

As mentioned above, the above-mentioned top conductor is divided into at least two or more regions in the substrate for a light-emitting diode according to the present embodiment. Thereby, even when both of two electrodes (an anode electrode and a cathode electrode) of an LED are placed on the same surface of an LED element as mentioned above, an electrical connection can be established separately with respective one of these two electrodes, for example. Although an embodiment wherein the top conductor which the substrate for a light-emitting diode according to the present embodiment comprises is divided into at least two or more regions and these regions establish an electrical connection separately with respective one of these two electrodes of the LED was exemplified in the above-mentioned explanation, it should be noted that the present embodiment does not exclude a type of usage wherein the top conductor which the substrate for a light-emitting diode according to the present embodiment comprises is divided into at least two or more regions and these regions are electrically connected with either of the two electrodes of the LED.

By the way, in the substrate for a light-emitting diode according to the present embodiment, as mentioned above, said top conductor is divided into at least two or more regions. Therefore, for example, an air gap between these two or more regions may be filled with an insulation material (dielectric material) for the purpose of improving an insulation reliability between these two or more regions, etc.

Namely, the third embodiment of the present invention is, the substrate for a light-emitting diode according to said second embodiment of the present invention, wherein:

a dielectric material fills a gap between said at least two or more regions of said top conductor.

As mentioned above, in the substrate for a light-emitting diode according to the present embodiment, a dielectric material fills a gap between said at least two or more regions of said top conductor. Thereby, in the substrate for a light-emitting diode according to the present embodiment, an insulation reliability between two or more regions of the top conductor divided into at least two or more regions can be improved, for example. In addition, a dielectric material which fills a gap between these two or more regions is not limited in particular, and can be chosen suitably from various materials widely used in the art as a packing material, etc., depending on a usage environment of the substrate, etc. Alternatively, the dielectric material may be the same material as the dielectric material which constitutes the insulation layer that the substrate for a light-emitting diode according to the present embodiment comprises.

In accordance with the substrate for a light-emitting diode according to the present invention including various embodiments which have been explained above, a high heat dissipation capacity can be shown by achieving a low thermal resistance as the total thermal resistance of the whole substrate, without reducing the insulation reliability and high-humidity reliability of the substrate. As a result, reduction of the energy efficiency of the LED due to the temperature-rise of the LED by heat generation accompanying a light emission of the LED can be suppressed without reducing the insulation reliability and high-humidity reliability of a package containing the LED.

Hereinafter, substrates for a light-emitting diode according to some embodiments of the present invention will be explained in more detail. However, the following explanations are absolutely intended for exemplification, and the scope of the present invention should not be interpreted to be limited to the following explanations.

EXAMPLE

1. Production Method of Substrate for Light-Emitting Diode

Figure 1:
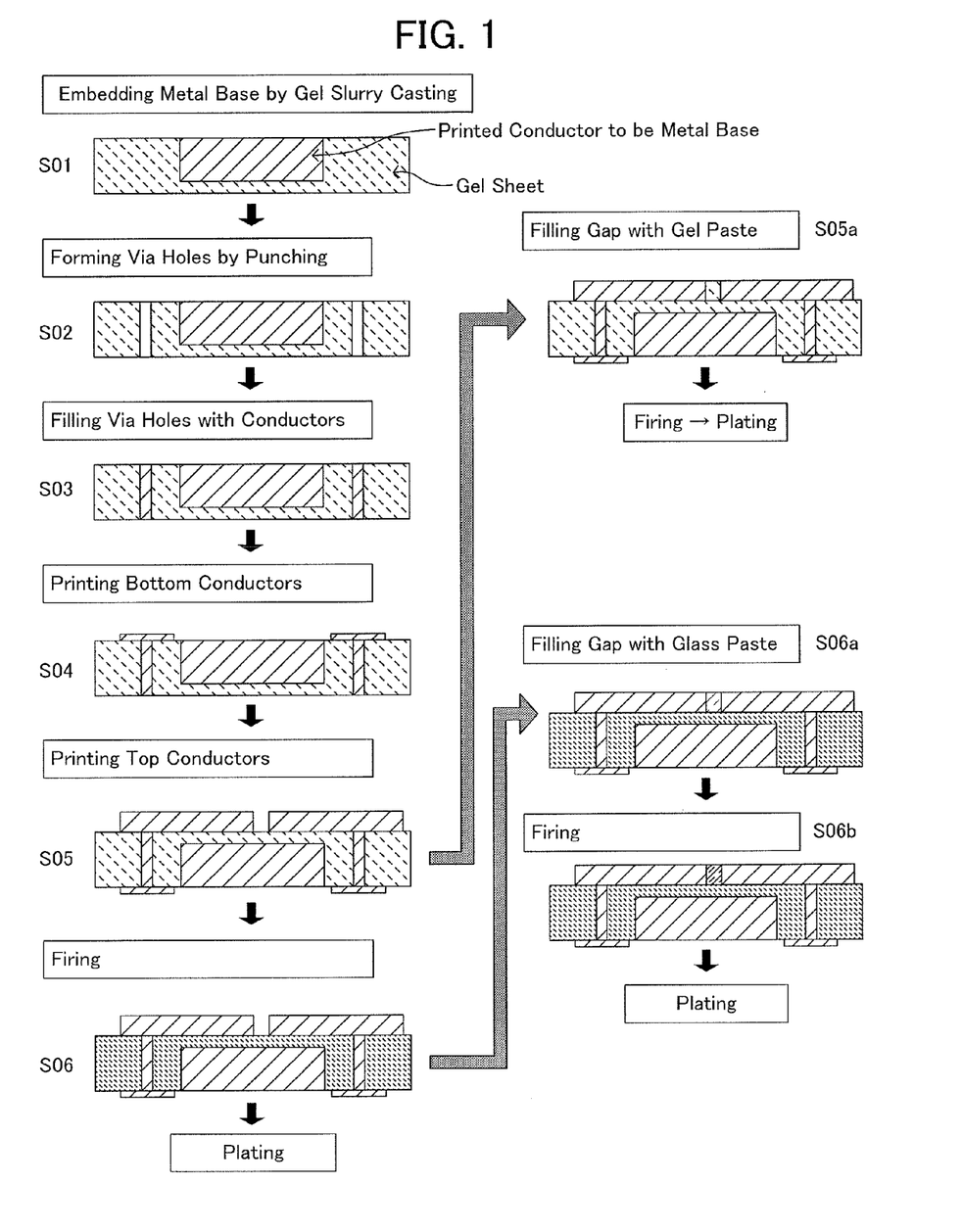
FIG. 1 is a schematic view showing an example of a production method of a substrate for a light-emitting diode according to one embodiment of the present invention.

First, an example of a production method of a substrate for a light-emitting diode according to the present invention will be explained below referring to accompanying drawings. FIG. 1 is a schematic view showing an example of a production method of a substrate for a light-emitting diode according to one embodiment of the present invention, as mentioned above. As shown in FIG. 1, in the production method according to this working example, first, in step S01, a gel sheet within which a metal base with a predetermined thickness (in this working example, 300 micrometers) is embedded was prepared. In addition, in this working example, a ceramic gel slurry mainly comprising a ceramic was used as a slurry of a dielectric material, and copper was used as a metal base. Moreover, a gel sheet with such a metal base embedded therein was prepared by the above-mentioned "gel slurry casting method." Furthermore, in this working example, one principal plane of a plate-like metal base and the surface of the gel sheet were constituted so as to exist and exposed at an identical plane in one principal plane of the gel sheet (i.e., so as to be a "flush surface").

Next, in step S02, a via hole for disposing a via conductor used in order to electrically connect a top conductor and a bottom conductor later was formed by a punching processing. Furthermore, in step S03, the via hole formed as mentioned above was filled with a conductive paste by a printing method. In this working example, the resulting gel sheet is referred to as a "front side gel sheet." In addition, in this working example, in step S04, a bottom conductor for connecting the substrate to a printed board, etc. was placed on one principal plane (back) on the side where the metal base was exposed by a printing methods (for instance, a screen printing, etc.) so as to be connected with the above-mentioned via conductor.

Next, in step S05, a top conductor was placed so as to be connected with the above-mentioned via conductor on the principal plane (front) opposite to the principal plane (back) where the metal base was exposed. Thereby, since the above-mentioned bottom conductor and the top conductor can be electrically connected through the above-mentioned via conductor, it becomes possible to connect the substrate, on which an LED is mounted, with a printed board, etc. through the bottom conductor. Moreover, a layer of a dielectric material which exists between the top conductor and the metal base corresponds to the "insulation layer" in the substrate for a light-emitting diode according to the present invention. In addition, the top conductor can be formed by printing a conductive paste on the gel sheet using a printing method (for instance, a screen printing, etc.). Alternatively, a previously formed top conductor may be laminated on the gel sheet. In addition, in this working example, the top conductor is divided into two regions.

After the gel sheet which comprises a metal base and a via conductor inside thereof, the top conductor on its top, and the bottom conductor on its back side is prepared as mentioned above, in step S06, a substrate for a light-emitting diode, which has the top conductor divided into two regions, can be manufactured by firing the gel sheet (namely, co-firing the metal base, the dielectric material, the top conductor and the via conductor).

In addition, as shown in step 5a of FIG. 1, a substrate for a light-emitting diode in which a dielectric material fills a gap between the divided regions of the top conductor can be also manufactured by filling the gap with a gel paste comprising a dielectric material, such as a ceramic, etc. (for instance, by a printing method) before the firing process in step S06 and thereafter executing the firing process. In this case, the dielectric material filling the gap between the divided regions of the top conductor is co-fired together with the gel sheet. Therefore, the dielectric material filling the gap between the divided regions of the top conductor may be the same material as the dielectric material of the gel sheet.

Alternatively, as shown in steps 6a and 6b of FIG. 1, a substrate for a light-emitting diode in which a dielectric material fills a gap between the divided regions of the top conductor can be also manufactured by filling the gap with a paste comprising a dielectric material (for instance, glass, etc.) which can be fired at a lower temperature as compared with the dielectric material which the gel sheet comprises (a material mainly comprising a ceramic) (for example, by a printing method) after the firing process in step S06 and thereafter firing the dielectric material for filling. In this case, it is desirable that a material (for instance, glass system dielectric material, etc.) which can be fired at a temperature lower than the firing temperature of the gel sheet is chosen as the dielectric material filling the gap between the divided regions of the top conductor.

In addition, a plating process may be implemented on the substrate manufactured in any of step S06, step S05a and step S06b after a firing process to plate the tops of the top conductor and the bottom conductor. Moreover, the above is absolutely just an exemplification, and it should not be interpreted that a production method of a substrate for a light-emitting diode according to the present invention is limited to the above.

2. Valuation of Various Sample Substrates

Figure 2:
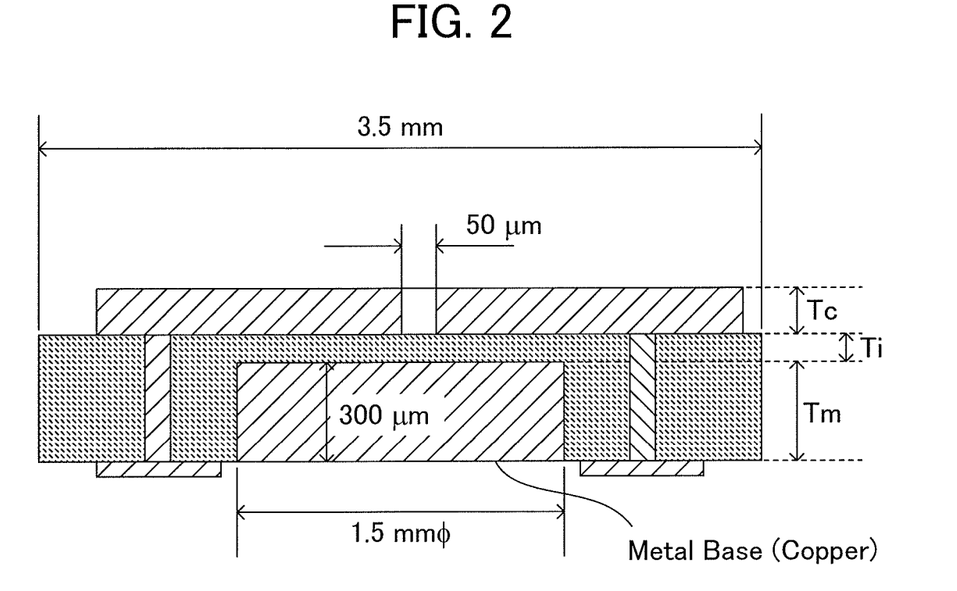
FIG. 2 is a schematic view showing an example of a configuration of a substrate for a light-emitting diode according to one embodiment of the present invention.

By the above-mentioned production method, various samples for a valuation of the substrate for a light-emitting diode which have various combinations of the thickness (Tc) of a top conductor and the thickness (Ti) of an insulation layer were manufactured. Here, the various samples for a valuation of the substrate for a light-emitting diode according to this working example will be explained, referring to an accompanying drawing. FIG. 2 is a schematic view showing an example of a configuration of a substrate for a light-emitting diode according to one embodiment of the present invention, as mentioned above. As shown in FIG. 2, the "thickness" of each component member which constitutes the substrate for a light-emitting diode according to this working example is a term which refers to the dimension of each component member in a direction in which a metal base, an insulation layer and a top conductor are laminated (namely, a direction perpendicular to the interface of these component members). In other words, the "thickness direction" in the substrate for a light-emitting diode according to this working example is defined as a direction which intersects perpendicularly with the top of a metal base as an interface between an insulation layer, with which a top conductor is laminated, and a metal base.

In addition, although various samples for a valuation of the substrate for a light-emitting diode which had various combinations of the thickness (Tc) of a top conductor and the thickness (Ti) of an insulation layer were evaluated in this working example, as shown in FIG. 2, in all the samples, a metal base was constituted by a material which comprised copper (Cu) as a principal component, the thickness thereof was constant at 300 micrometers, and the dimension was 1.5 mm square. Moreover, the dimension of the substrate was 3.5 mm square, and the gap between two regions of a top conductor was 50 micrometers. Under such conditions, various samples for a valuation of the substrate for a light-emitting diode with the thickness (Tc) of a top conductor and the thickness (Ti) of an insulation layer variously changed as shown in the following Table 1 and Table 2 were manufactured, and the influences of the thickness (Tc) of the top conductor and the thickness (Ti) of the insulation layer on the electric insulation of the whole substrate (existence or non-existence of an electrical short), the occurrence of a crack in the insulation layer after a heat cycle test (H/C), and the extent of a thermal resistance were investigated. The results of such valuations will be explained in detail below.

In addition, as for the electric insulation of the whole substrate, the existence or non-existence of an electrical short between the top conductor and the metal base was inspected after manufacturing the various samples for a valuation of the substrate for a light-emitting diode, and the one in which an electrical short was observed was judged as "poor" and the one in which no electrical short was observed was judged as "good". Moreover, as for the occurrence of a crack in the insulation layer after a heat cycle test, each of the various samples for a valuation of the substrate for a light-emitting diode manufactured as mentioned above was subjected to a cycle, in which the temperature was raised from −40° C. to 150° C. for 5 minutes after holding at 40° C. for 30 minutes, and the temperature was lowered from 150° C. to −40° C. for 5 minutes after holding at 150° C. for 30 minutes, 500 times, respectively, and thereafter the substrates were immersed in molten solder to dissolve the top conductor containing, for instance, copper (Cu) or silver (Ag), etc. and remove the top conductor, and the existence or non-existence of the occurrence of a crack in the insulation layer was investigated by a red-check inspection. Furthermore, the extent of the thermal resistance was measured in conformity to the electronic circuit board test method for a high-intensity LED of JPCA (Japan Electronics Packaging and Circuits Association).

(a) Relation Between Thickness (Tc) of Top Conductor and Thickness (Ti) of Insulation Layer In this working example, first, the influences of the combination of the thickness (Tc) of a top conductor and the thickness (Ti) of an insulation layer on an electric insulation and an occurrence of a crack accompanying a heat cycle test were investigated. The combinations of the thickness (Tc) of a top conductor and the thickness (Ti) of an insulation layer in the various samples for a valuation, and the evaluation results about the electric insulation and the occurrence of a crack accompanying a heat cycle test are enumerated in the following Table 1.

TABLE 1

|  | Tc [μm] | Ti [μm] | Electric Insulation | Crack after H/C | Overall Valuation |
| --- | --- | --- | --- | --- | --- |
| WE P-1 | 20 | 6 | Good | None | Good |
| WE P-2 | 60 | 5 | Good | None | Good |
| WE P-3 | 80 | 4.5 | Good | None | Good |
| WE P-4 | 100 | 4 | Good | None | Good |
| WE P-5 | 20 | 40 | Good | None | Good |
| WE P-6 | 60 | 39 | Good | None | Good |
| WE P-7 | 80 | 38.5 | Good | None | Good |
| WE P-8 | 100 | 38 | Good | None | Good |
| CE P-1 | 20 | 5 | Poor | None | Poor |
| CE P-2 | 60 | 4 | Poor | None | Poor |
| CE P-3 | 80 | 4 | Poor | None | Poor |
| CE P-4 | 100 | 3 | Poor | None | Poor |
| CE P-5 | 20 | 42 | Good | Exist | Poor |
| CE P-6 | 60 | 41 | Good | Exist | Poor |
| CE P-7 | 80 | 41 | Good | Exist | Poor |
| CE P-8 | 100 | 40 | Good | Exist | Poor |

As apparent from the results in Table 1, it turns out that the thickness (Ti) of an insulation layer needs to fall within a specific range in order to attain a good electric insulation and suppress the occurrence of a crack accompanying a heat cycle test, even if the thickness (Tc) of the top conductor falls within a suitable range in the present invention (not less than 20 micrometers, 100 micrometers or less). However, a good evaluation result was not obtained only by the thickness (Ti) of the insulation layer falling within a specific range, but it was observed that the upper limit and lower limit of the suitable range of the thickness (Ti) of an insulation layer change corresponding to the thickness (Tc) of a top conductor.

Specifically, even if the thickness (Ti) of an insulation layer is constant at 5 micrometers, while there is a problem in neither an electric insulation nor an occurrence of a crack and therefore it is judged as "good" when the thickness (Tc) of a top conductor is 60 micrometers (Working Example (WE)

P-2), an electric insulation is judged as "poor" when the thickness (Tc) of a top conductor is 20 micrometers (Comparative Example (CE) P-1). Moreover, even if the thickness (Ti) of an insulation layer is constant at 40 micrometers, while it is judged as "good" when the thickness (Tc) of a top conductor is 20 micrometers (WE P-5), an occurrence of a crack accompanying a heat cycle test was observed when the thickness (Tc) of a top conductor was 100 micrometers (CE P-8).

Then, from a relation between various combinations of the thickness (Tc) of a top conductor and the thickness (Ti) of an insulation layer and the evaluation results about the corresponding samples for a valuation, it was found out that, in the substrate in which the thickness (Tm) of a metal base is not less than 100 micrometers, a good result in both of an electric insulation and occurrence of a crack accompanying a heat cycle test can be obtained when the thickness (Ti) of an insulation layer and the thickness (Tc) of a top conductor meet the relation expressed by the formula (1) shown below.

$$-40 \times Ti + 260 \leq Tc \leq -40 \times Ti + 1620 \quad (1)$$

(b) Suitable Range of Thickness (Tc) of Top Conductor

In the above (a), it has been confirmed that, in order to obtain a good result in an electric insulation and an occurrence of a crack accompanying a heat cycle test, the thickness (Ti) of an insulation layer and the thickness (Tc) of a top conductor need to meet the relation expressed by the above-mentioned formula (1). Next, in this working example, the influence of the thickness (Tc) of a top conductor on the thermal resistance of the whole substrate was investigated. The combinations of the thickness (Tc) of a top conductor and the thickness (Ti) of an insulation layer in the various samples for a valuation and the evaluation results about the thermal resistance as and the whole substrate are enumerated in the following Table 2.

In addition, since the absolute value of a total thermal resistance of a whole substrate is greatly influenced with the thickness (Ti) of an insulation layer which the substrate comprises, in this working example, the thermal resistances in various thicknesses (Tc) of top conductors were investigated for each of a group with the thickness (Ti) of the insulation layer constant at 6 micrometers (hereinafter, will be referred to as "Q group") and a group with the thickness (Ti) of the insulation layer constant at 38 micrometers (hereinafter, will be referred to as "R group"). In addition, in both groups, from the viewpoints of a soldering property with an LED and a bond strength with a substrate, etc., for example, the lower limit of the thickness (Tc) of a top conductor was set to 5 micrometers, and relative values (percentages) of the thermal resistances on the basis of the sample with the thickness (Tc) of the top conductor constant at 5 micrometers in each group (CE Q-1 and CE R-1) were compared.

TABLE 2

| | Tc [μm] | Ti [μm] | Thermal Resistance (TR) [° C./W] | Relative Value of TR [%] | Comment |
|---|---|---|---|---|---|
| CE Q-1 | 5 | 6 | 2.8 | 100 | Reference |
| CE Q-2 | 10 | 6 | 2.7 | 96 | |
| CE Q-3 | 15 | 6 | 2.6 | 93 | |
| WE Q-1 | 20 | 6 | 2.0 | 71 | Greatly Reduced Thermal Resistance |
| WE Q-2 | 25 | 6 | 1.7 | 61 | |
| WE Q-3 | 50 | 6 | 1.5 | 54 | |
| WE Q-4 | 75 | 6 | 1.4 | 40 | |
| WE Q-5 | 100 | 6 | 1.3 | 46 | |
| CE Q-4 | 110 | 6 | — | — | Crack after H/C |
| CE R-1 | 5 | 38 | 8.2 | 100 | Reference |
| CE R-2 | 10 | 38 | 8.0 | 98 | |
| CE R-3 | 15 | 38 | 7.7 | 94 | |
| WE R-1 | 20 | 38 | 6.0 | 73 | Greatly Reduced Thermal Resistance |
| WE R-2 | 25 | 38 | 5.4 | 66 | |
| WE R-3 | 50 | 38 | 5.0 | 61 | |
| WE R-4 | 75 | 38 | 4.8 | 59 | |
| WE R-5 | 100 | 38 | 4.7 | 57 | |
| CE R-4 | 110 | 38 | — | — | Crack after H/C |

As apparent from the results in Table 2, it was observed that the total thermal resistance of the whole substrate has a tendency to fall in association with an increase of the thickness (Tc) of a top conductor in both cases where the thickness (Ti) of an insulation layer is 6 micrometers and 38 micrometers (namely, in any of Q group and R group). It is thought that this is because, the larger the thickness (Tc) of a top conductor is, the more likely the heat conducted into the inside of a top conductor through an electric connection section with an LED (namely, an external surface of the top conductor) conducts deeply in the thickness direction of a substrate when the heat passes through the inside of the top conductor to be conducted to an insulation layer which intervenes between a metal base and the top conductor, as well as, the heat spreads to a larger area in a plane parallel to the principal plane of the substrate and therefore the influence of a relatively high thermal resistance of the insulation layer on the total thermal resistance of the whole substrate when conducting the heat to the metal base through the insulation layer is reduced.

Furthermore, as apparent from the results in Table 2, the tendency of the total thermal resistance of the whole substrate to fall in association with an increase of the thickness (Tc) of a top conductor was more noticeable in the samples with the thickness (Tc) of the top conductor of not less than 20 micrometers (WE Q-1 to Q-5, and WE R-1 and R-5). On the other hand, in the samples with thickness (Tc) of a top conductor of more than 110 micrometers (CE Q-4 and CE R-4), an occurrence of a crack accompanying a heat cycle test (H/C) was observed. Namely, it was confirmed to be desirable that the thickness (Tc) of a top conductor is not less than 20 micrometers and 100 micrometers or less, in order to efficiently reduce the total thermal resistance of the whole substrate, without reducing a reliability of a substrate, in a substrate for a light-emitting diode according to this working example.

3. Conclusion

As mentioned above, it has been confirmed that a high heat dissipation capacity can be shown without reducing an insulation reliability and a high-humidity reliability of a substrate by achieving a low thermal resistance as the total thermal resistance of the whole substrate, in accordance with a substrate for a light-emitting diode according to the present invention, which is constituted so that the thickness of a top conductor for an electrical connection with a light-emitting diode (LED) falls within a predetermined range (specifically, not less than 20 micrometers and 100 micrometers or less) and the thickness of the insulation layer which electrically insulates a metal base and a top conductor and the thickness of a top conductor meet a predetermined relation (specifically, the relation expressed by formula (1)), even in a case where the substrate comprises a metal base which has a thickness of a predetermined value (specifically, 100 micrometers) or more.

Although some embodiment and corresponding working examples which have a specific configuration have been explained, sometimes referring to accompanying drawings, as mentioned above, for the purpose of explaining the present invention, the scope of the present invention should not be interpreted to be limited to these exemplary embodiments and working examples, and it is needless to say that modifications can be suitably added within the range of the matters described in the claims and the specification.

The invention claimed is:

1. A substrate for a light-emitting diode, comprising:
   a metal base,
   an insulation layer which comprises a dielectric material that mainly contains a ceramic and which has a portion placed on a first top surface of said metal base, and
   a top conductor which is placed on a top surface of said insulation layer on the side opposite to said first top surface,
   wherein:
   said insulation layer also covers side surfaces of said metal base,
   a thickness (Tm) of said metal base in a thickness direction, which is defined as a direction intersecting perpendicularly with said first top surface of said metal base, is at least 100 micrometers,
   a thickness (Tc) of said top conductor in said thickness direction is 20 micrometers to 100 micrometers, and
   a thickness (Ti) of a portion between said first top surface and said top conductor in said insulation layer in said thickness direction and said thickness (Tc) of said top conductor in said thickness direction meet the relation expressed by:

$$-40 \times Ti + 260 \leq Tc \leq -40 \times Ti + 1620.$$

2. The substrate for a light-emitting diode according to claim 1, wherein:
   said top conductor is divided into at least two or more regions.

3. The substrate for a light-emitting diode according to claim 2, wherein:
   a dielectric material fills a gap between said at least two or more regions of said top conductor.

* * * * *